United States Patent
Taniguchi

(10) Patent No.: US 7,327,205 B2
(45) Date of Patent: Feb. 5, 2008

(54) DEMULTIPLEXER AND SURFACE ACOUSTIC WAVE FILTER

(75) Inventor: Norio Taniguchi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 232 days.

(21) Appl. No.: 10/550,116

(22) PCT Filed: Feb. 23, 2005

(86) PCT No.: PCT/JP2005/002896

§ 371 (c)(1),
(2), (4) Date: Sep. 19, 2005

(87) PCT Pub. No.: WO2005/088835

PCT Pub. Date: Sep. 22, 2005

(65) Prior Publication Data

US 2006/0181366 A1    Aug. 17, 2006

(30) Foreign Application Priority Data

Mar. 12, 2004   (JP) .............................. 2004-071152

(51) Int. Cl.
  *H03H 9/72*   (2006.01)
  *H03H 9/70*   (2006.01)
  *H03H 9/64*   (2006.01)
  *H03H 9/54*   (2006.01)

(52) U.S. Cl. ..................... 333/133; 333/189; 333/193

(58) Field of Classification Search ................ 333/193, 333/195, 133, 189
See application file for complete search history.

(56) References Cited

U.S. PATENT DOCUMENTS

| 4,456,850 | A  | 6/1984 | Inoue et al. |
| RE37,365  | E  | 9/2001 | Satoh et al. |
| 6,516,503 | B1 | 2/2003 | Ikada et al. |
| 6,946,930 | B2* | 9/2005 | Kadota et al. ............... 333/195 |

(Continued)

FOREIGN PATENT DOCUMENTS

| JP | 58-121815 | 7/1983 |
| JP | 58-137317 | 8/1983 |

(Continued)

OTHER PUBLICATIONS

Official Communication dated Jun. 7, 2005, issued in the corresponding PCT Application No. PCT/JP2005/002896 (with full English translation).

*Primary Examiner*—Barbara Summons
(74) *Attorney, Agent, or Firm*—Keating & Bennett, LLP

(57) ABSTRACT

A branching filter includes a first filter with a relatively low passband and having a first temperature property-improvement thin film, and a second filter with a relatively high passband and having a second temperature property-improvement thin film. In the branching filter, the thickness of the first temperature property-improvement thin film is different from that of the second temperature property-improvement thin film such that the temperature coefficient of frequency of the first filter is greater than that of the second filter.

20 Claims, 11 Drawing Sheets

U.S. PATENT DOCUMENTS

| | | |
|---|---|---|
| 6,989,723 B2 * | 1/2006 | Komuro et al. ............. 333/133 |
| 7,002,437 B2 * | 2/2006 | Takeuchi et al. ............ 333/187 |
| 2003/0137367 A1 * | 7/2003 | Kadota ....................... 333/195 |
| 2003/0141947 A1 | 7/2003 | Kadota et al. |
| 2003/0151329 A1 * | 8/2003 | Kadota et al. .......... 310/313 A |

FOREIGN PATENT DOCUMENTS

| | | |
|---|---|---|
| JP | 02-037815 | 2/1990 |
| JP | 03-128517 | 5/1991 |
| JP | 05-167388 | 7/1993 |
| JP | 05-183380 | 7/1993 |
| JP | 06-260876 | 9/1994 |
| JP | 2000-223908 | 8/2000 |
| JP | 2000-341068 | 12/2000 |
| JP | 2001-111382 | 4/2001 |
| JP | 2001-285024 | 10/2001 |
| JP | 2003-087085 | 3/2003 |
| JP | 2003-258602 | 9/2003 |

\* cited by examiner

FREQUENCY

FREQUENCY

DEMULTIPLEXER AND SURFACE ACOUSTIC WAVE FILTER

BACKGROUND OF THE INVENTION

1. Field of the Invention

The present invention relates a branching filter including a first filter and second filter, which have different passbands from each other and which are connected to each other, and a surface acoustic wave device used in the branching filter, and more particularly, to a branching filter having improved temperature properties and a surface acoustic wave device used in the branching filter.

2. Description of the Related Art

In communication apparatuses such as a mobile phone, a branching filter including a first filter and a second filter has been widely used. The first filter and the second filter have different passbands from each other and are connected to each other. For example, in Japanese Unexamined Patent Application Publication No. 5-167388, a branching filter having a circuit structure shown in FIG. 17 is disclosed.

In a branching filter 101, a first filter 103 and a second filter 104 are connected to an input terminal 102. The first filter 103 includes a series arm resonator $S_{01}$ and a parallel arm resonator $P_{01}$, and the second filter 104 includes a series arm resonator $S_{02}$ and a parallel arm resonator $P_{02}$. In this branching filter, the series arm resonators $S_{01}$ and $S_{02}$ and the parallel arm resonators $P_{01}$ and $P_{02}$ are each defined by a surface acoustic wave resonator. That is, by using a surface acoustic wave filter including two surface acoustic wave resonators connected to each other, the first filter 103 and the second filter 104 are each provided.

In addition, the first filter 103 has a passband that is lower than that of the second filter 104 and is used as a transmission filter. On the other hand, the second filter 104 is used as a reception filter.

Furthermore, in the branching filter described in Japanese Unexamined Patent Application Publication No. 5-167388, inductance elements and capacitor elements (not shown) are connected in the first filter 103 and the second filter 104 so as to achieve matching therebetween.

On the other hand, in Japanese Unexamined Patent Application Publication No. 2-37815, a surface acoustic wave device is disclosed in which electrodes are provided on a piezoelectric substrate, and a $SiO_2$ film having a polarity of a temperature coefficient of frequency opposite to that of a piezoelectric single crystal forming the piezoelectric substrate is provided to improve temperature properties.

When the branching filter 101 described in Japanese Unexamined Patent Application Publication No. 5-167388 is used as a branching filter in a communication apparatus in which the spacing between the passband of a transmission filter and the passband of a reception filter is extremely small, since the temperature properties of the first filter 103 and that of the second filter 104 are insufficient, specification properties may not be satisfied in a desired service temperature range. In this case, the specification properties represent the frequency properties, such as the in-band loss and the amount of attenuation, in the first filter 103 and the second filter 104 of the branching filter 101.

In addition, when a $SiO_2$ film is provided only on a piezoelectric substrate in order to improve the temperature properties as disclosed in Japanese Unexamined Patent Application Publication No. 2-37815, it is difficult to sufficiently ensure the specification properties of the branching filter.

In particular, even when a branching filter is provided which has a small temperature coefficient of frequency due to the $SiO_2$ film, for example, when a PCS communication system in which the passband at the transmission side is 1,850 MHz to 1,910 MHz, the passband at the reception side is 1,930 MHz to 1,990 MHz, and an amount of attenuation of 42 dB or more must be provided in the passband of the other side filter, there has been a problem in that the specification properties cannot be satisfied.

That is, when the thickness of a $SiO_2$ film is increased in order to decrease the temperature coefficient of frequency, although the temperature coefficient of frequency is close to zero, the increase in film thickness of the $SiO_2$ film causes a decrease in the electromechanical coefficient. As a result, the band width is decreased.

In addition, a ladder filter is commonly used to define this type of branching filter. A method for broadening the band width of a ladder filter toward a low frequency side is known in which the inductance of an inductance element which is connected in series to a parallel arm resonator to define the ladder filter is increased. This method is effective for broadening the band width in the first filter 103 of the branching filter having a relatively low passband.

However, in the second filter 104 side having a relatively high passband, the amount of attenuation at a low frequency side, that is, the amount of attenuation in the passband of the other side filter, i.e., the filter 103, is degraded. As a result, the method described above cannot be used.

In addition, a method for broadening the passband of the second filter 104 of the branching filter having a relatively high passband toward a high frequency side may be provided in which inductance elements are added in parallel to the series arm resonators of the ladder filter. However, with this method, the inductance elements added for broadening the passband of the ladder filter to a high frequency side cause mutual induction therebetween. As a result, it is difficult to ensure sufficient attenuation properties.

In a branching filter which must have a sufficient passband and sufficient attenuation properties, by simply decreasing the temperature coefficient of frequency TCF, it is very difficult to satisfactorily obtain the necessary passband width and amount of attenuation in the desired service temperature range.

SUMMARY OF THE INVENTION

To overcome the problems described above, preferred embodiments of the present invention provide a branching filter and a surface acoustic wave device used therein. The branching filter provides a sufficiently large band width and amount of attenuation in a desired service temperature range, even when used in a communication apparatus in which the spacing between the two passbands is small.

A branching filter according to a preferred embodiment of the present invention includes a first filter having a relatively low passband and a first temperature property-improvement thin film, and a second filter having a relatively high passband and a second temperature property-improvement thin film, in which the thickness of the first temperature property-improvement thin film is different from that of the second temperature property-improvement thin film such that the temperature coefficient of frequency of the first filter is greater than that of the second filter.

The first filter and the second filter are preferably defined by surface acoustic wave filters.

The first filter and the second filter are preferably piezoelectric thin-film resonance filters.

Each of the surface acoustic wave filters are preferably formed using a piezoelectric substrate made of a LiTaO$_3$ substrate or a LiNbO$_3$ substrate, and each of the first and the second temperature property-improvement thin films are preferably formed of a SiO$_2$ film provided on the piezoelectric substrate.

The thickness of the SiO$_2$ film provided for the first filter is preferably greater than that of the SiO$_2$ film provided for the second filter.

When the wavelength of the first filter is represented by $\lambda 1$, the thickness of the SiO$_2$ film of the first filter is preferably in the range of about 0.18 $\lambda 1$ to about 0.38 $\lambda 1$.

When the wavelength of the second filter is represented by $\lambda 2$, the thickness of the SiO$_2$ film provided on the second filter is preferably in the range of about 0.08 $\lambda 2$ to about 0.28 $\lambda 2$.

Each of the first filter and the second filter are preferably ladder filters including series arm resonators and parallel arm resonators.

At least one inductance element is preferably connected in series to one of the parallel arm resonators of the ladder filter defining the first filter.

At least one inductance element is preferably connected in parallel to one of the series arm resonators of the ladder filter defining the second filter.

The first filter and the second filter are preferably provided on respective piezoelectric substrates and are defined by respective chip components.

According to another preferred embodiment of the present invention, the first filter and the second filter are preferably provided on the same piezoelectric substrate and are collectively defined by a single chip component.

A surface acoustic wave filter according to preferred embodiments of the present invention is preferably used as a reception filter of a branching filter, in which the surface acoustic wave filter is configured such that the temperature coefficient of frequency thereof is positive with respect to the change in temperature.

A surface acoustic wave filter according to another preferred embodiment of the present invention includes a piezoelectric substrate made of a LiTaO$_3$ or a LiNbO$_3$ substrate, electrodes provided on the piezoelectric substrate, and a temperature property-improvement thin film of a SiO$_2$ film arranged so as to cover the electrodes on the piezoelectric substrate, and when the wavelength determined by an electrode cycle is represented by $\lambda$, the thickness of the SiO$_2$ film is in the range of about 0.3 $\lambda$ to about 0.38 $\lambda$ so as to have a positive temperature coefficient of frequency with respect to the change in temperature.

The thicknesses of the temperature property-improvement thin films of the first and the second filters are preferably different from each other such that the temperature coefficient of frequency of the first filter having a relatively low passband is greater than that of the second filter. Thus, when the spacing in frequency between the passband of the first filter and that of the second filter is small, the variation in frequency at a high frequency side of the passband in the first filter having a relatively low passband is increased. As a result, the production yield may be decreased. However, according to preferred embodiments of the present invention, in the first filter, the change in frequency-temperature properties at a high frequency side of the passband is decreased, and in the second filter, the change in temperature properties at a low frequency side of the passband is decreased. Thus, over a desired service temperature range, sufficient passband width and amount of attenuation is achieved.

Thus, according to preferred embodiments of the present invention, as a branching filter used for applications in which the spacing between the transmission side frequency and the reception side frequency is small, a branching filter that is capable of satisfying sufficient specification properties over a desired service temperature range is provided.

When the first and the second filters are each defined by a surface acoustic wave filter, the branching filter according to preferred embodiments of the present invention can be miniaturized.

When the first filter and the second filter are each defined by a piezoelectric thin-film resonator filter, the branching filter can be miniaturized.

When the surface acoustic wave filter includes a piezoelectric substrate made of a LiTaO$_3$ or a LiNbO$_3$ substrate, and the first and the second temperature property-improvement thin films are SiO$_2$ films provided on the piezoelectric substrate, the temperature properties are effectively improved with a simple structure.

When the thickness of the SiO$_2$ film provided for the first filter is greater than that of the SiO$_2$ film provided for the second filter, by simply changing the thicknesses of the SiO$_2$ films, the temperature properties of the first and the second filters can be easily adjusted.

When the thickness of the SiO$_2$ film of the first filter is in the range of about 0.18 $\lambda 1$ to about 0.38 $\lambda 1$, the frequency-temperature properties of the first filter are effectively improved.

In addition, when the thickness of the SiO$_2$ film provided for the second filter is in the range of about 0.08 $\lambda 2$ to about 0.28 $\lambda 2$, the frequency-temperature properties of the second filter are effectively improved.

When the first and the second filters are defined by ladder filters each including series arm resonators and parallel arm resonators, by using ladder filters that are commonly used for this type of band filter, a branching filter according to preferred embodiments of the present invention is provided.

When at least one inductance element connected in series to one of the parallel arm resonators of the ladder filter defining the first filter is provided, the first filter can be matched with the second filter.

As described above, when at least one inductance element is connected in parallel to one of the series arm resonators of the ladder filter defining the second filter, the second filter can be easily matched with the first filter.

When the first and the second filters are provided on respective piezoelectric substrates and are defined by respective chip components, the configurations of the first and the second filters are easily optimized.

In addition, when the first and the second filters are provided on the same piezoelectric substrate and are collectively defined by a single component, a branching filter according to preferred embodiments of the present invention can be miniaturized.

Since the surface acoustic wave filter according to preferred embodiments of the present invention is preferably used as a transmission filter of a branching filter and is configured such that the temperature coefficient of frequency is positive with respect to the change in temperature, even when electrical power is supplied at a high frequency side of the passband, degradation in insertion loss is not likely to occur. Thus, an optimum surface acoustic wave filter as a transmission filter of a branching filter is provided.

In particular, when the surface acoustic wave filter includes a piezoelectric substrate made of a LiTaO$_3$ or a LiNbO$_3$ substrate, electrodes provided on the piezoelectric substrate, and a temperature property-improvement thin film of a SiO$_2$ film arranged so as to cover the electrodes on the piezoelectric substrate, and in which when the wavelength determined by an electrode cycle is represented by $\lambda$, the thickness of the SiO$_2$ film is preferably in the range of about 0.3 $\lambda$ to about 0.38 $\lambda$ so as to have a positive temperature coefficient of frequency with respect to the change in temperature, the temperature coefficient of frequency TCF of the surface acoustic wave is positive, and the temperature coefficient of frequency of the branching filter as a whole is decreased.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Figure 1:
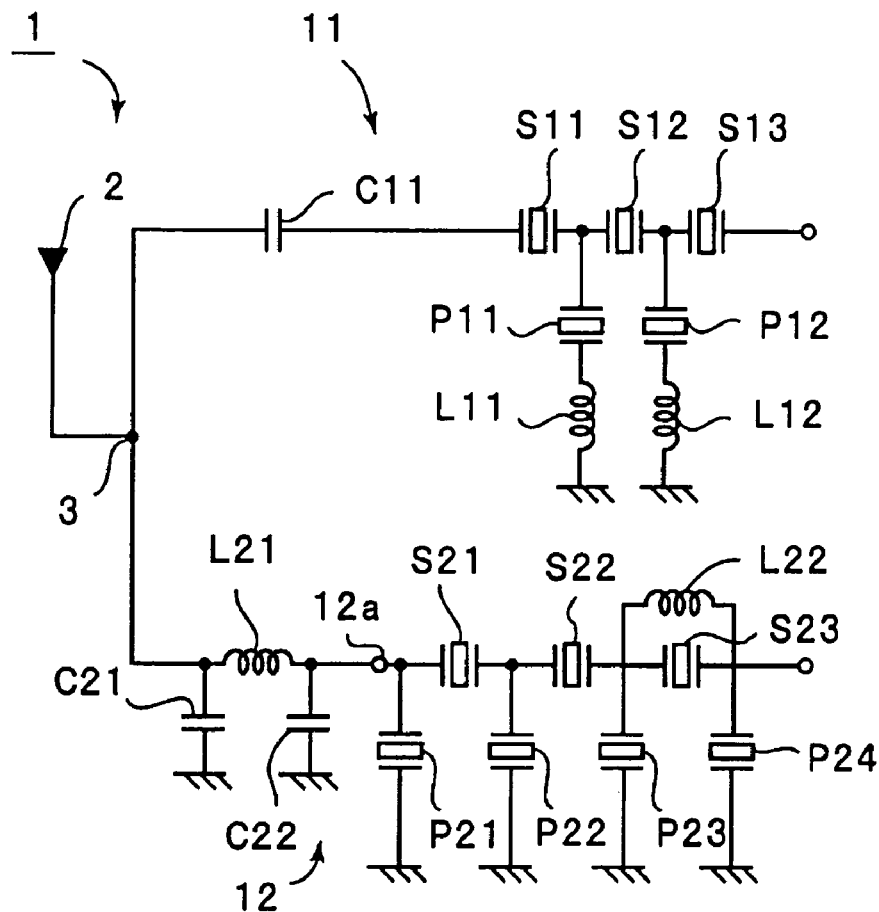
FIG. 1 is a circuit diagram showing a circuit structure of a branching filter according to a preferred embodiment of the present invention.

FIG. 1 is a view showing a circuit structure of a branching filter according to a first preferred embodiment of the present invention.

A branching filter 1 according to this preferred embodiment includes an input terminal 3 of an antenna 2. To the input terminal 3, a first filter 11 and a second filter 12 are connected. The first filter 11 has a relatively low passband, and the second filter 12 has a relatively high passband. That is, in the branching filter 1, the first filter 11 is a transmission filter and the second filter 12 is a reception filter.

In addition, in this preferred embodiment, the first filter 11 is defined a ladder filter including series arm resonators S11 to S13 and parallel arm resonators P11 and P12. Furthermore, between the parallel arm resonators P11 and P12 and a ground potential, inductance elements L11 and L12 are connected, respectively.

In addition, between the input terminal 3 and the series arm resonator S11, a capacitor element C11 is connected.

The second filter 12 has a ladder type circuit configuration similar to the first filter 11. That is, the second filter 12 includes a plurality of series arm resonators S21 to S23 and a plurality of parallel arm resonators P21 to P24. In addition, an inductance element L22 is connected in parallel to the series arm resonator S23.

Between the input terminal 3 and an input terminal 12a of the second filter 12, an inductance element L21 is connected. Between the ground potential and a connection point provided between the input terminal 3 and the inductance element L21, a capacitor element C21 is connected. Between the ground potential and a connection point provided between the input terminal 12a and the inductance element L21, a capacitor element C22 is connected.

The capacitor element C11 connected to the first filter 11 is matching element. In addition, the inductance element L21 and the capacitor elements C21 and C22 are arranged to match the second filter 12 with the first filter 11. That is, the inductance element L21 and the capacitor elements C21 and C22 define a matching circuit.

In the branching filter 1 according this preferred embodiment, the first filter 11 and the second filter 12 include a first temperature property-improvement thin film and a second temperature property-improvement thin film, respectively, and the thicknesses thereof are different from each other such that a temperature coefficient of frequency TCF of the first filter 11 is greater than that of the second filter 12. Thus, with the structure described above, sufficient specification properties in a service temperature range are obtained. Hereinafter, the details will be described.

In a surface acoustic wave filter and a piezoelectric thin-film resonance filter, fine electrodes or very thin electrode films are provided, and as a result, the electrical resistance is relatively high. Thus, when the environmental temperature is increased, the resistivity is changed. As a result, there has been a problem in that filter loss is increased. The change in properties of a filter caused by the change in temperature will be described with reference to FIG. 2.

Figure 2:
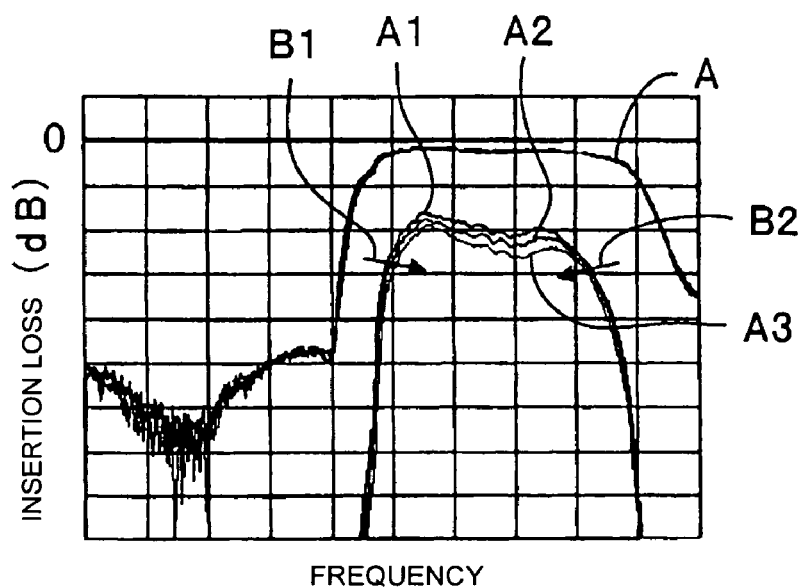
FIG. 2 is a view illustrating the change in frequency properties of a second filter of a branching filter, the change being caused by the change in temperature.

FIG. 2 shows general frequency properties of this type of filter. A solid line A shown in FIG. 2 indicates the frequency property, and solid lines A1 to A3 show the states of the change in the frequency property A, which is caused by the change in temperature, by enlarging the scale of the vertical axis indicating the insertion loss. The solid lines A1, A2, and A3 indicate the properties in the passband at approximately −30° C., 25° C., and +85° C., respectively, the properties being shown using enlarged values.

When the shift of the central frequency caused by the change in temperature is assumed not to occur at all, at a low frequency side of the passband, the degradation in loss caused by the increase in temperature is equivalent to that obtained when the frequency is shifted to a high frequency side as shown by an arrow B1 in FIG. 2, and at a high frequency side, the degradation is equivalent to that obtained when the frequency is shifted to a low frequency side as shown by an arrow B2.

Figure 3:
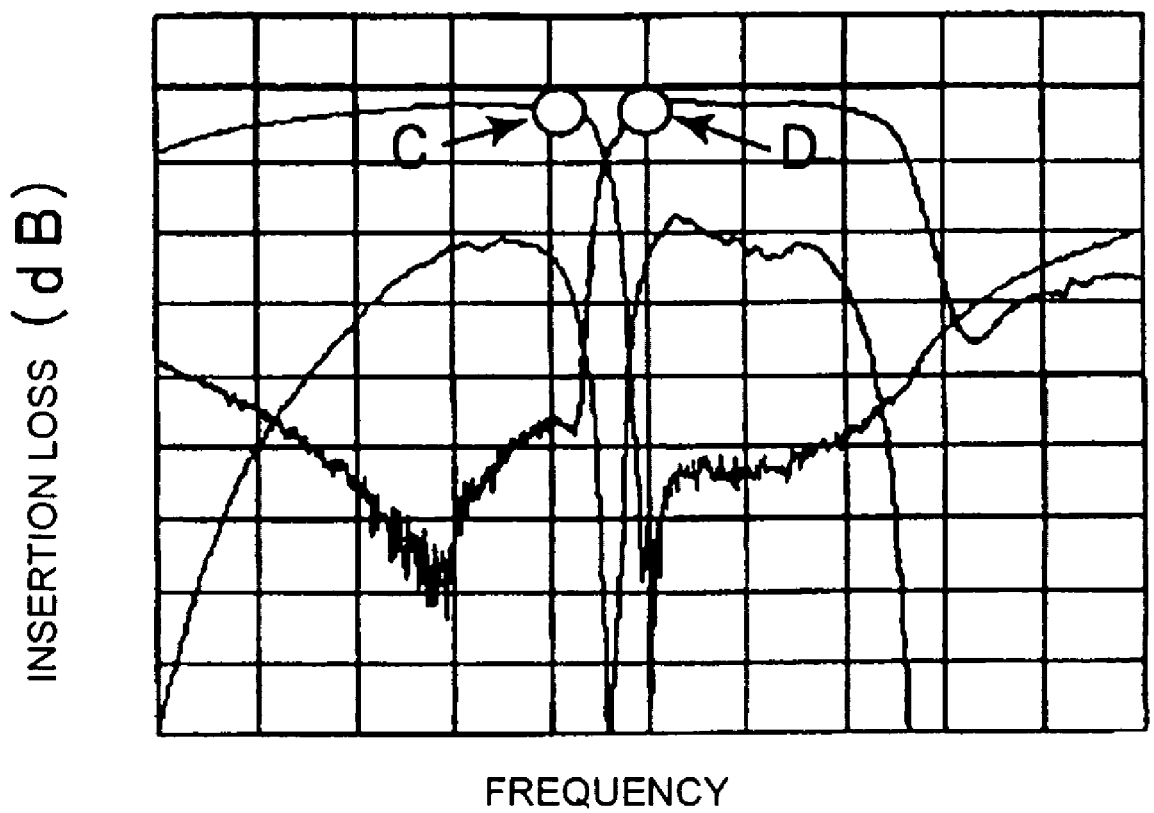
FIG. 3 is a view illustrating the frequency properties of first and second filters of a branching filter.

Furthermore, in a branching filter in which a first filter having a relatively low passband and a second filter having a relatively high passband are provided in combination, when the spacing between the respective frequencies is extremely small, as shown in FIG. 3, the temperature dependence of frequency at a high frequency side (indicated by an arrow C) of the passband of the first filter may be decreased, and the temperature dependence of frequency at a low frequency side of the second filter, (indicated by an arrow D) may be decreased. With the structure as described above, the variations in frequency of the branching filter as a whole which occurs during production are decreased.

In preferred embodiments of the present invention, the amount of change in frequency caused by the change in temperature is decreased at the central frequency of the second filter having a relatively high passband as compared to that of the first filter having a relatively low passband, such that the variation in frequency of the branching filter as a whole is decreased.

In this specification of the present invention, the case in which the temperature coefficient of frequency is small indicates that, for example, −20 ppm is small relative to −10 ppm, and −5 ppm is small relative to +5 ppm. That is, it is to be understood that a small temperature coefficient of frequency is not determined by the absolute value thereof, and that as the TCF is decreased toward a negative value side, the temperature coefficient of frequency is referred to as small. Accordingly, "the temperature coefficient of frequency is larger" indicates that the temperature coefficient of frequency TCF has a more positive value.

Figure 4A:
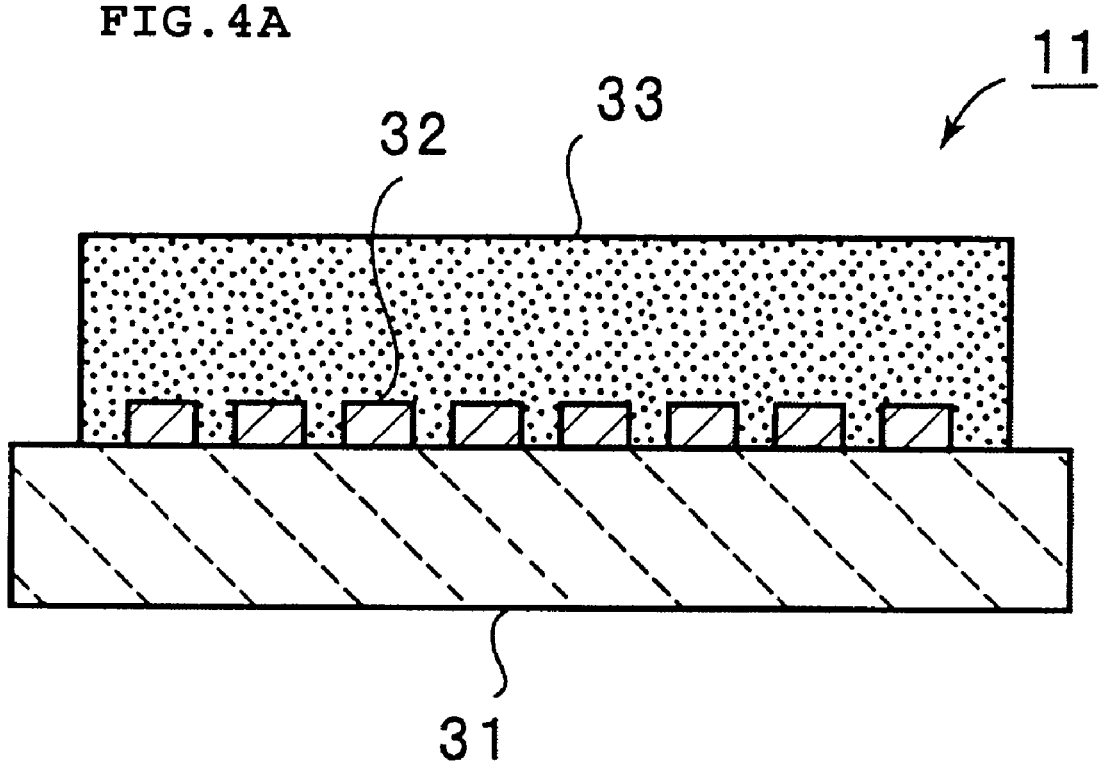
FIGS. 4(a) and 4(b) are schematic views showing the structures of a first and a second filter, respectively, used in a branching filter of a preferred embodiment of the present invention.
Figure 4B:
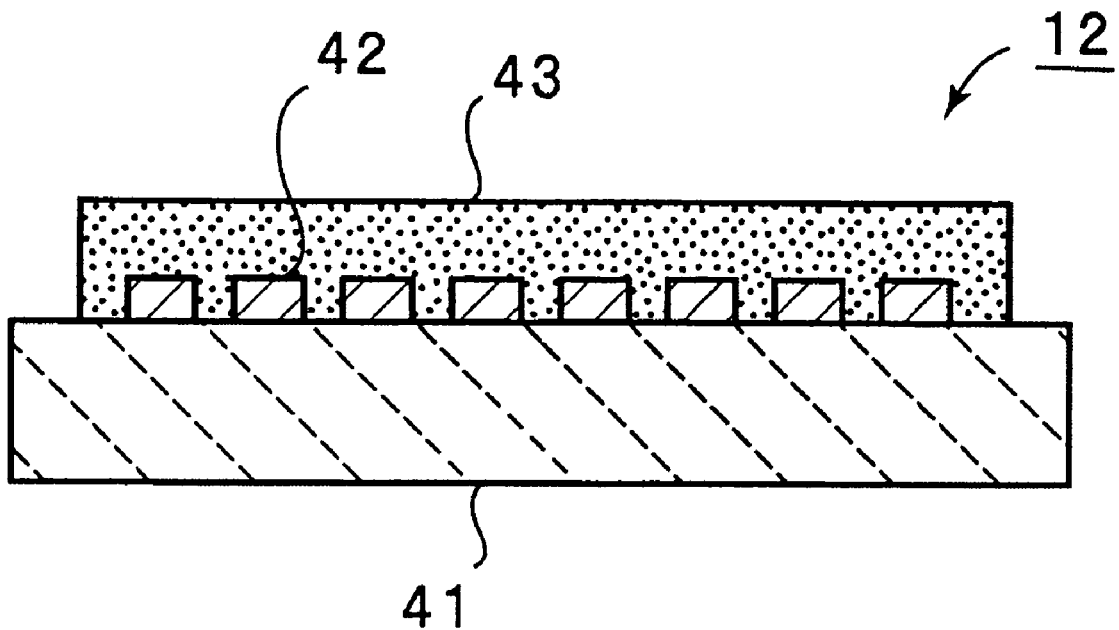

FIGS. 4(a) and 4(b) are schematic front cross-sectional views of the first filter 11 and the second filter 12, respectively, of the branching filter 1 according to the above-described preferred embodiment.

The first filter 11 shown in FIG. 4(a) is a filter having a relatively low passband and, in this preferred embodiment, is defined by a surface acoustic wave filter. The first filter 11 includes electrodes 32, such as IDT electrodes, which are provided on a piezoelectric substrate 31. In addition, a first temperature property-improvement thin film 33 is arranged so as to cover the electrodes 32.

In this preferred embodiment, the piezoelectric substrate 31 is preferably a $LiTaO_3$ substrate. In addition, the electrodes 32 preferably are primarily made of Cu, and the first temperature property-improvement thin film 33 is made of $SiO_2$.

The second filter 12 shown in FIG. 4(b) includes electrodes 42, such as IDT electrodes, which are provided on a piezoelectric substrate 41. A second temperature property-improvement thin film 43 is arranged so as to cover the electrodes 42. In the second filter 12, the piezoelectric substrate 41 is a $LiTaO_3$ substrate, the electrodes 42 preferably primarily include Cu, and the second temperature property-improvement thin film 43 is made of $SiO_2$. In this preferred embodiment, with respect to $LiTaO_3$ having a negative temperature coefficient of frequency, the temperature property-improvement thin films 33 and 43, which are provided for improving the temperature properties, are each made of $SiO_2$ having a positive temperature coefficient of frequency. In addition, as shown in FIGS. 4(a) and 4(b), the thickness of the first temperature property-improvement thin film 33 provided for the first filter 11 having a relatively low passband is greater than that of the temperature property-improvement thin film 43 provided for the second filter 12 having a relatively high passband.

Figure 5:
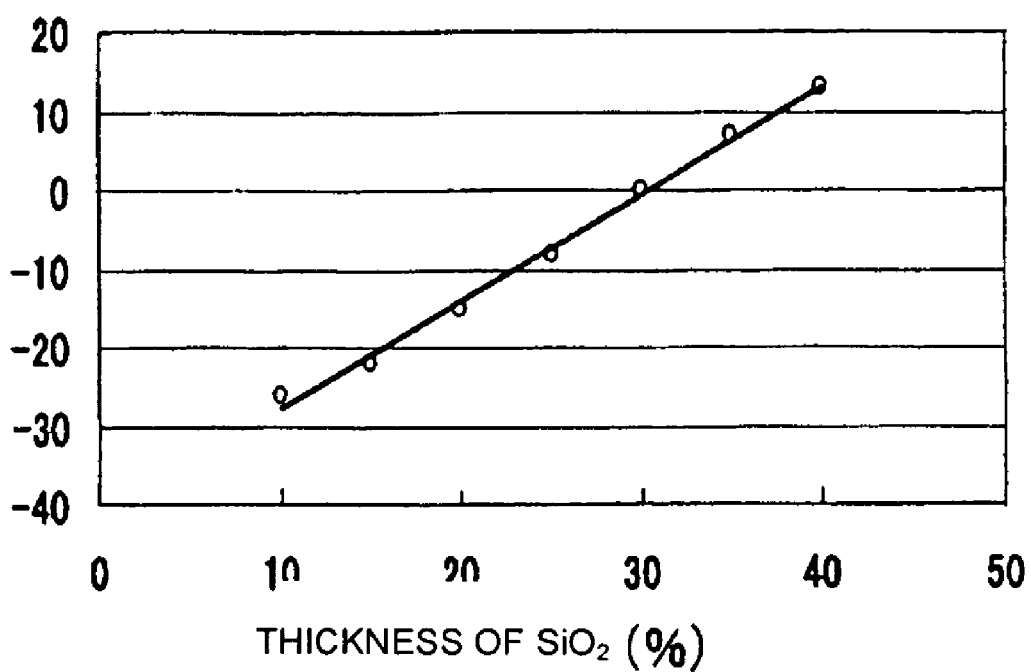
FIG. 5 is a view showing the positive change in temperature dependence of a surface acoustic wave device when the thickness of a SiO$_2$ film is changed.

FIG. 5 is a view showing the relationship between the temperature coefficient of frequency TCF and the thickness of a $SiO_2$ film arranged so as to cover the electrodes of a surface acoustic wave device.

As shown FIG. 5, as the thickness of the $SiO_2$ film increases, the temperature coefficient of frequency TCF is shifted to a positive side. That is, the temperature coefficient of frequency increases.

As shown in FIGS. 4(a) and 4(b), in this preferred embodiment, the thickness of the first temperature property-improvement thin film 33 of the first filter 11 having a relatively low passband is relatively large, and the thickness of the temperature property-improvement thin film 43 of the second filter 12 having a relatively high passband is relatively small. Thus, the temperature coefficient of frequency of the first filter 11 is increased, and the temperature coefficient of frequency of the second filter 12 is increased to a lesser extent than the the first filter. Accordingly, in the branching filter as a whole, the temperature dependence of frequency is suppressed, and the variation in frequency is decreased. In other words, the specification property in a desired service temperature range is ensured. The details will be described with reference to particular experimental examples.

EXAMPLE 1

The branching filter 1 of the preferred embodiment shown in FIG. 1 was formed by the following procedure. The first filter 11 is a transmission filter, and the second filter 12 is a reception filter. The branching filter 1 is a filter used in a system in which the filter band of the transmission side is about 1,850 MHz to about 1,910 MHz, and the passband of the reception filter is about 1,930 MHz to about 1,990 MHz.

In the above-described system, the frequency spacing between the passband of the transmission filter and that of the reception filter is very small, such as about 20 MHz. Thus, both of the first filter and the second filter are required to have steep filter properties. In addition, both of the first filter and the second filter are required to have superior temperature dependence of frequency.

In particular, since the first filter 11 defining the transmission filter must use the passband of the reception filter 12 as an attenuation band, the steepness at a high frequency side of the passband of the first filter 11 must be enhanced. In addition, improvement in temperature dependence at a high frequency side of the passband is required.

Figure 6:
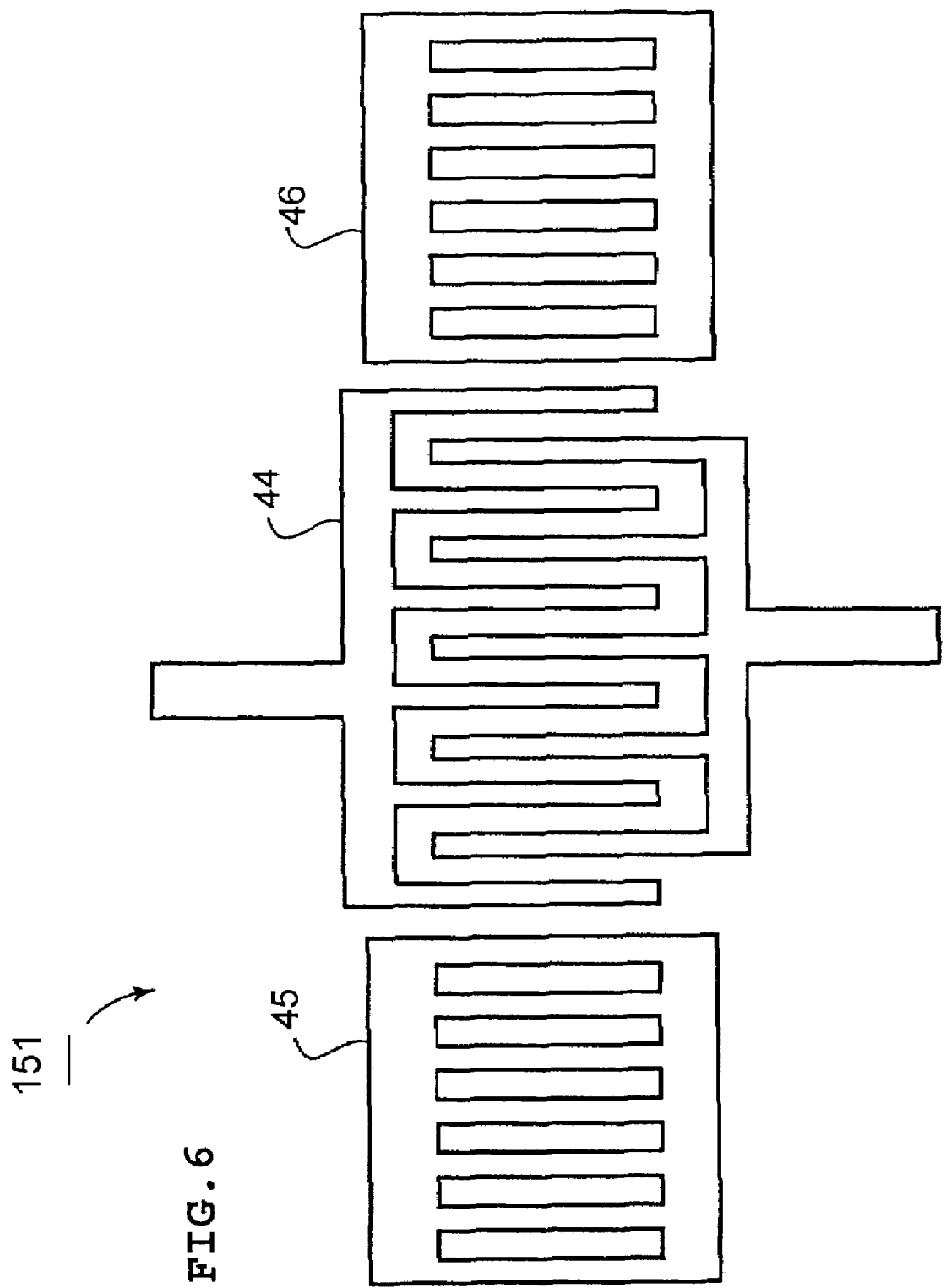
FIG. 6 is a plan view showing an electrode structure of a surface acoustic wave resonator forming the surface acoustic wave filter used in a preferred embodiment of the present invention.

On the other hand, since the second filter 12 as the reception filter must use the passband of the first filter 11 as an attenuation band, in addition to the enhancement of the steepness at a low frequency side of the passband of the second filter 12, improvement in temperature dependence at a low frequency side of the passband is also required. As the series arm resonators and the parallel arm resonators defining the first filter 11 and the second filter 12, surface acoustic wave resonators having the electrode structure shown in FIG. 6 were used. An electrode structure 151 shown in FIG. 6 includes an IDT electrode 44 and reflectors 45 and 46 provided at both sides of the IDT electrode 44. The electrode structure 151 is provided on a piezoelectric substrate, such that one surface acoustic wave resonator is provided. As shown in FIG. 1, the first filter 11 includes the series arm resonators S11 to S13 and the parallel arm resonators P11 and P12, and the second filter 12 includes the series arm resonators S21 to S23 and the parallel arm resonators P21 to P24. These series arm resonators S11 to S13, S21 to S23 and parallel arm resonators P11, P12, P21 to P24 are each defined by the above-described surface acoustic wave resonator.

In addition, the first filter 11 and the second filter 12 have the circuit structures shown in FIG. 1. Electrode parameters of the individual resonators of the first and the second filters are shown in Tables 1 and 2 below.

TABLE 1

|  | S11 | P11 | S12 | P12 | S13 |
|---|---|---|---|---|---|
| DUTY | 0.55 | 0.55 | 0.55 | 0.55 | 0.55 |
| NUMBER OF STAGES | 2 | 1 | 3 | 1 | 2 |
| NUMBER of ELECTRODE FINGER PAIRS | 200 | 120 | 200 | 120 | 200 |
| CROSS WIDTH (μM) | 40 | 100 | 40 | 100 | 40 |
| NUMBER OF ELECTRODE FINGERS OF REFLECTOR | 20 | 20 | 20 | 20 | 20 |
| WAVELENGTH (μm) | 2.0275 | 2.0682 | 2.0152 | 2.0682 | 2.0275 |

TABLE 2

|  | P21 | S21 | P22 | S22 | P23 | S23 | P24 |
|---|---|---|---|---|---|---|---|
| DUTY | 0.55 | 0.55 | 0.55 | 0.55 | 0.55 | 0.55 | 0.55 |
| NUMBER OF STAGES | 1 | 2 | 1 | 2 | 1 | 1 | 1 |
| NUMBER OF ELECTRODE FINGER PAIRS | 40 | 120 | 100 | 120 | 100 | 120 | 40 |
| CROSS WIDTH (μm) | 40 | 40 | 40 | 40 | 40 | 40 | 40 |
| NUMBER OF ELECTRODE FINGERS OF REFLECTOR | 20 | 20 | 20 | 20 | 20 | 20 | 20 |
| WAVELENGTH (μm) | 1.9620 | 1.8890 | 1.9620 | 1.8890 | 1.9620 | 1.9300 | 1.9620 |

The electrostatic capacitance of the capacitor element C11 of the first filter 11 was set to about 5 pF. In addition, the inductance of each of the inductance elements L11 and L12 was set to about 3 nH. Furthermore, the inductance of the inductance element L21 of the second filter 12 was set to about 3 nH, the inductance of the inductance element L22 was set to about 3 nH, the capacitance of the capacitor element C21 was set to about 2 pF, and the capacitance of the capacitor element C22 was set to about 2.5 pF.

In this example, the first filter 11 and the second filter 12 are collectively defined by a single chip component using the same 36° X propagating LiTaO₃ substrate. That is, on one LiTaO₃ substrate, a first circuit structure is provided. Since the above-described filters are defined by a single chip component, the branching filter 1 is miniaturized.

The electrodes preferably are each primarily made of Cu, and as described above, in the first filter 11 and the second filter 12, the first temperature property-improvement thin film 33 made of SiO₂ and the second temperature property-improvement thin film 43 made of SiO₂ are provided, respectively (see FIGS. 4(a) and 4(b)). The formation of the SiO₂ film was performed by sputtering. In addition, the thickness of the SiO₂ film as the first temperature property-improvement thin film 33 of the first filter 11 was set to about 0.35 $\lambda 1$, that is, about 715 nm, when the average wavelength of the first filter 11 was represented by $\lambda 1$. The average wavelength is an average value of the wavelengths of the parallel arm resonators and the wavelengths of the series arm resonators.

On the other hand, in the second filter 12, the thickness of the SiO₂ film as the second temperature property-improvement thin film 43 was set to about 0.25 $\lambda 2$, that is, 483 nm, when the average wavelength was represented by $\lambda 2$.

The frequency-temperature properties of the first filter 11 and the second filter 12 of the branching filter 1 formed as described above are shown in FIGS. 7 and 8, respectively.

Figure 7:
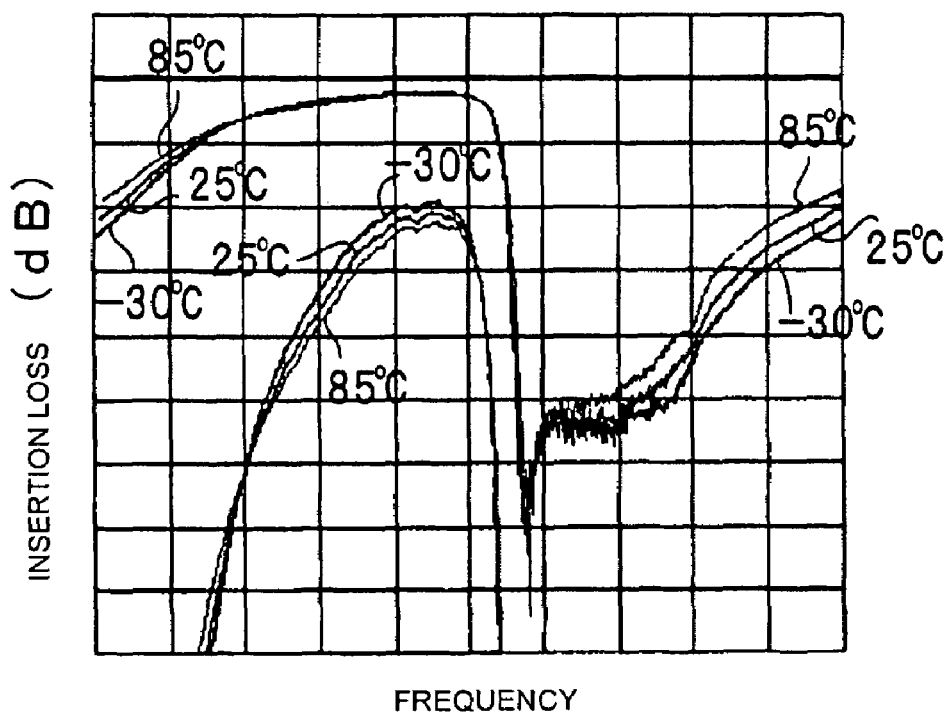
FIG. 7 is a view showing the change in frequency properties of a first filter suppressed in example 1, the change being caused by the change in temperature.
Figure 8:
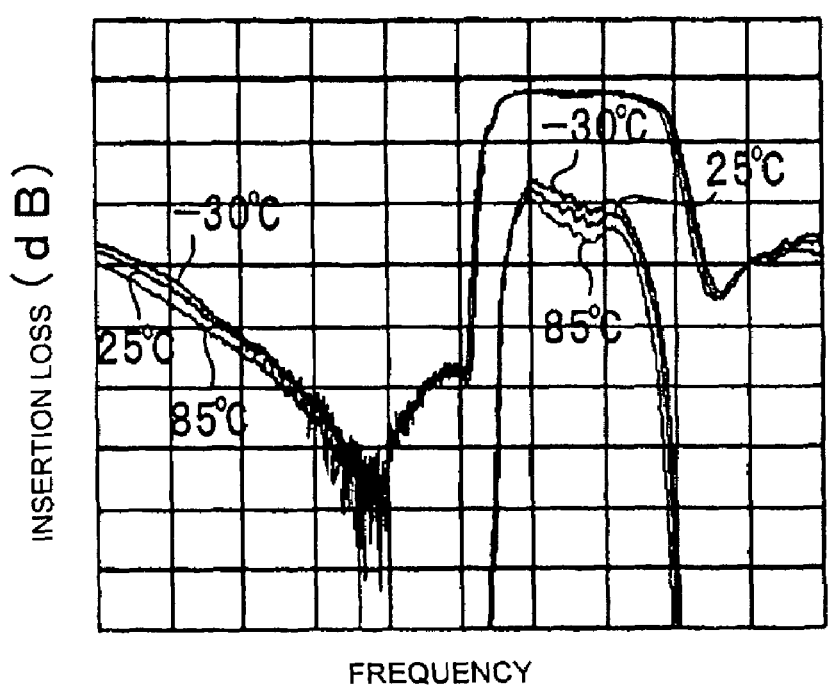
FIG. 8 is a view showing the change in frequency properties of a second filter suppressed in example 1, the change being caused by the change in temperature.

In FIGS. 7 and 8, properties shown in a lower side are important portions of the properties shown in an upper side and are shown by an enlarged scale of the vertical axis. In addition, in FIGS. 7 and 8, the frequency properties at temperatures of approximately −30° C., 25° C., and 85° C. are shown.

Since the second filter 12 is a reception filter, the amount of attenuation must be ensured in the passband of the first filter 11 which is present at a low frequency side of the passband of the second filter 12. Thus, in the frequency properties of the second filter 12 shown in FIG. 8, superior temperature dependence of frequency must be ensured at a low frequency side of the passband.

On the other hand, the amount of increase in loss at a low frequency side of the passband caused by an increase in temperature is equivalent to that of the change obtained when the frequency is shifted to a high frequency side (see FIG. 2). Accordingly, when the temperature coefficient TCF of the central frequency of the second filter 12 is set to approximately −7 ppm/° C., the amount of frequency shift of the second filter 12 at a low frequency side caused by the change in temperature is approximately zero.

In addition, as shown in FIG. 7, the first filter 11 is a transmission filter, and the amount of attenuation thereof must be sufficiently increased in the passband of the reception filter which is present at a high frequency side of the passband of the first filter 11, and in particular, a superior temperature dependence of frequency must be ensured at a high frequency side of the passband. As shown in FIG. 2, the amount of increase in loss at a high frequency side of the passband caused by increase in temperature is equivalent to that of the change obtained when the frequency is shifted to a low frequency side. Accordingly, in the first filter 11, when the temperature dependence of the central frequency is selected to be approximately +7 ppm/° C., the amount of frequency shift at a high frequency side is approximately zero.

Figure 9:
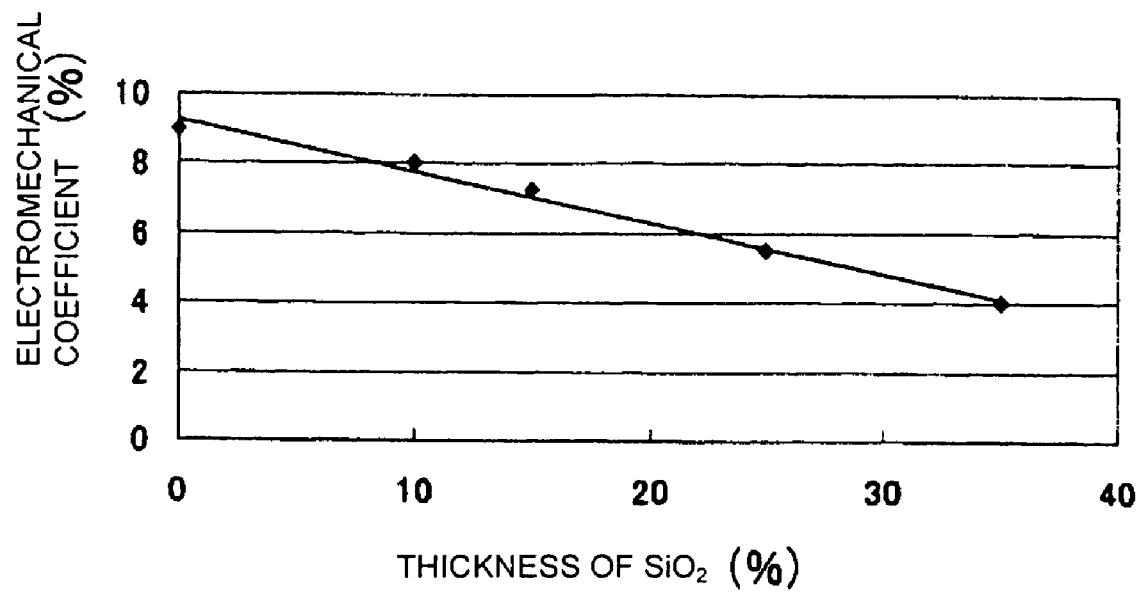
FIG. 9 is a view showing the change in electromechanical coefficient of a surface acoustic wave device when the thickness of a SiO$_2$ filter is changed.

In addition, FIG. 9 shows the change in electromechanical coefficient of this type of surface acoustic wave filter which is obtained when the thickness of the $SiO_2$ film is changed. When the thickness of the $SiO_2$ film is increased, due to the increased mass, the electromechanical coefficient is decreased. Thus, as a result, it becomes difficult to sufficiently increase the band width of the filter. Accordingly, in this example, the inductance elements L11 and L12 are connected in series to the parallel arm resonators P11 and P12, respectively, of the first filter 11, and thus, the band width is increased thereby.

In addition, the inductance element L22 is connected in parallel to the series arm resonator S23 of the second filter 12, such that the band width of the second filter 12 is also increased.

As a result, in the branching filter 1 of this example, as described above, the temperature dependence of frequency is decreased to approximately zero as a whole, variations in frequency properties in a service temperature range are not likely to occur, and the band widths of the respective filters 11 and 12 are sufficiently increased. Thus, in the service temperature range, the specification properties are satisfactorily obtained.

In this example, as the piezoelectric substrate, the 36° $LiTaO_3$ substrate was used. However, for example, a $LiTaO_3$ substrate having another cut angle such as a 42° $LiTaO_3$ substrate may also be used. Furthermore, a $LiNbO_3$ substrate may also be used.

Furthermore, a material for the electrode is not limited to a material primarily including Cu, and a material primarily including another metal, such as Al, may also be used.

In addition, $SiO_2$ films are preferably used as the first and the second temperature property-improvement thin films. However, the temperature property-improvement thin films may be formed of another suitable material. Furthermore, the first and the second temperature property-improvement thin films may be formed of materials that are different from each other.

EXAMPLE 2

A branching filter was formed in the same manner as that in example 1. However, in example 2, the thickness of the $SiO_2$ film as the first temperature property-improvement thin film 33 provided for the first filter 11 was set to about 0.25 λ1, that is, about 515 nm, and the thickness of the $SiO_2$ film provided for the second filter 12 was set to about 0.15 λ2, that is, about 290 nm. The remaining structure was the same as that in example 1.

Figure 10:
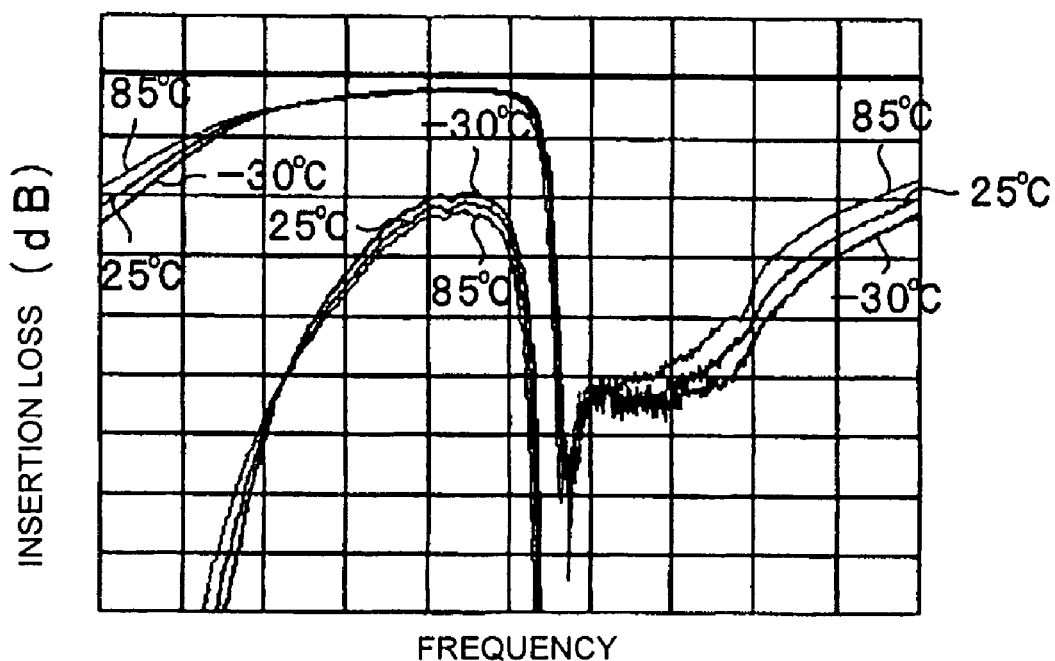
FIG. 10 is a view showing the change in frequency properties of a first filter according to example 2, the change being caused by the change in temperature.
Figure 11:
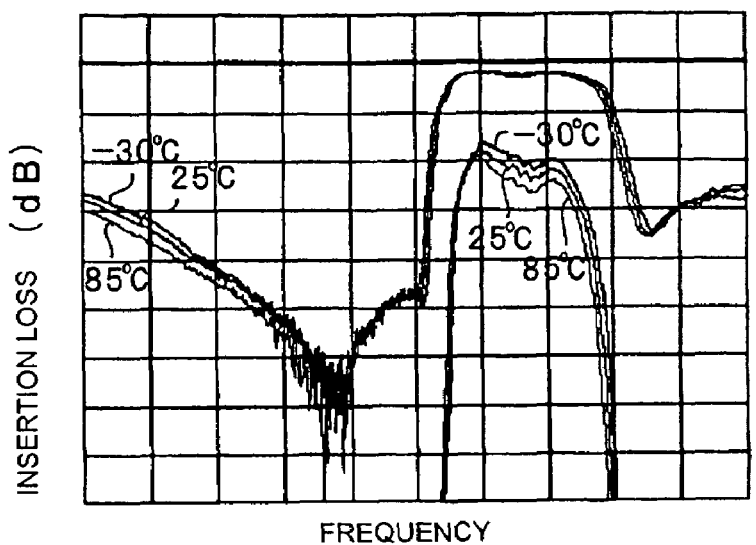
FIG. 11 is a view showing the change in frequency properties of a second filter according to example 2, the change being caused by the change in temperature.

FIG. 10 is a view showing the change in frequency properties of the first filter 11 of example 2 caused by the change in temperature, and FIG. 11 is a view showing the change in frequency properties of the second filter 12 caused by the change in temperature.

It is understood that the change of the central frequency of the first filter 11 is approximately −7 ppm/° C., and that the change of the central frequency of the second filter 12 is approximately −20 ppm/° C.

At a high frequency side of the passband, since the amount of change in the loss component caused by the increase in temperature works toward a negative side, the temperature dependence of frequency of the passband of the first filter 11 is approximately −14 ppm/° C. at a high frequency side.

On the other hand, at a low frequency side of the passband, since the amount of change caused by the increase in temperature is equivalent to that obtained when the frequency is shifted to a high frequency side, the temperature dependence of the frequency properties is decreased to approximately −14 ppm/° C., as in the first filter 11.

Thus, when the thickness of the $SiO_2$ film is increased at the first filter 11 side, the temperature dependence at a high frequency side of the passband of the first filter 11 and that at a low frequency side of the passband of the second filter 12 are approximately equal to each other. In example 2, compared to the case of example 1, although the temperature coefficient of frequency is slightly increased, in both the first filter 11 and the second filter 12, temperature dependences which are approximately equally suppressed are obtained. Thus, in production, a desired branching filter can be provided by easily combining a transmission filter and a reception filter with each other, both of which have temperature dependences approximately equal to each other.

In addition, in order to decrease the temperature coefficient of frequency, when the thickness of the $SiO_2$ film is increased too much, a problem as shown in FIG. 9 may arise in that the electromechanical coefficient is decreased. In example 2, since appropriate temperature property-improvement effect and electromechanical coefficient are obtained, a branching filter having superior frequency properties at room temperature is provided. In particular, in example 2, when the thickness of the $SiO_2$ film as the second temperature property-improvement thin film provided for the second filter is set in the range of about 0.08 λ2 to about 0.28 λ2, the temperature dependence of frequency of the second filter is improved at a low frequency side. In addition, when the thickness of the $SiO_2$ film as the first temperature property-improvement thin film provided for the first filter is set in the range of about 0.18 λ1 to about 0.38 λ1, the temperature dependence of frequency of the first filter as a transmission filter is improved at a high frequency side of the passband.

In the preferred embodiment described above, the first filter 11 and the second filter 12 are each defined by a surface acoustic wave filer. However, the first filter 11 and the second filter 12 are not limited to a surface acoustic wave filter, and may be formed using other suitable filters. That is, an appropriate filter having a temperature property-improvement thin film may be used as the first and the second filters. As the filters described above, for example, a piezoelectric thin-film resonator filter may preferably be used.

Figure 12:
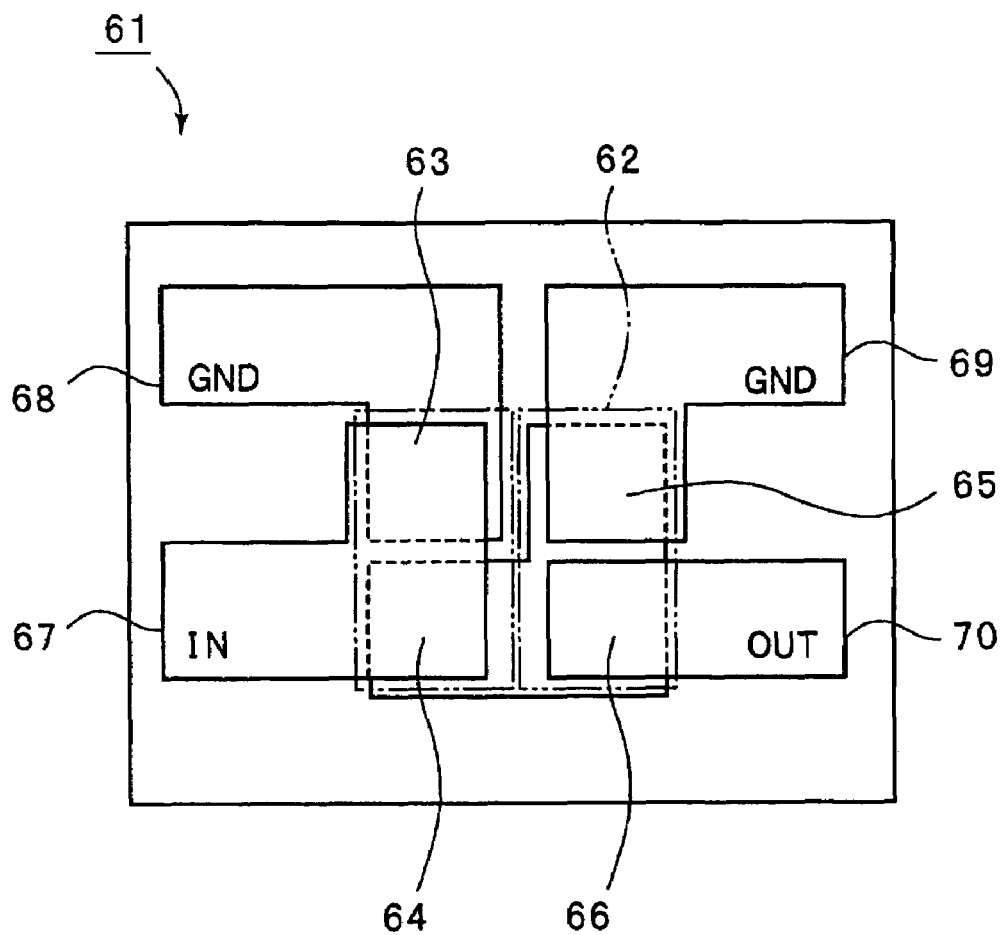
FIG. 12 is a schematic plan view illustrating a ladder filter used in a surface acoustic wave branching filter of an experimental example according to a preferred embodiment of the present invention.
Figure 13:
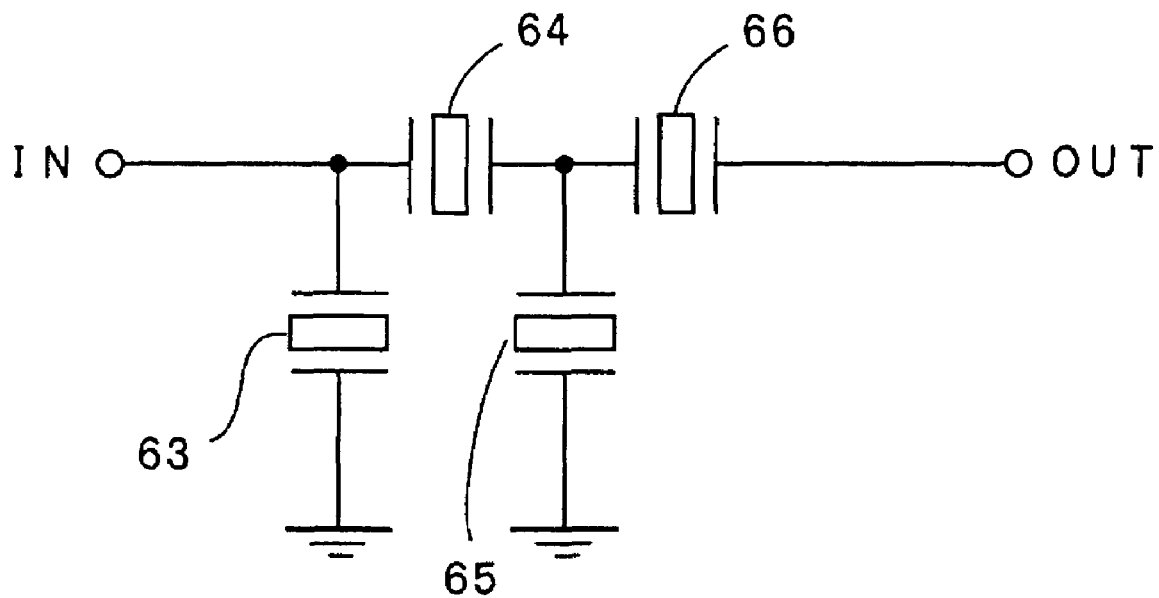
FIG. 13 is a view showing a circuit structure of the ladder filter shown in FIG. 12.

FIG. 12 is schematic plan view showing a ladder filter defined by a plurality of piezoelectric thin-film resonator filters, and the circuit structure of this ladder filter is shown in FIG. 13.

Figure 14:
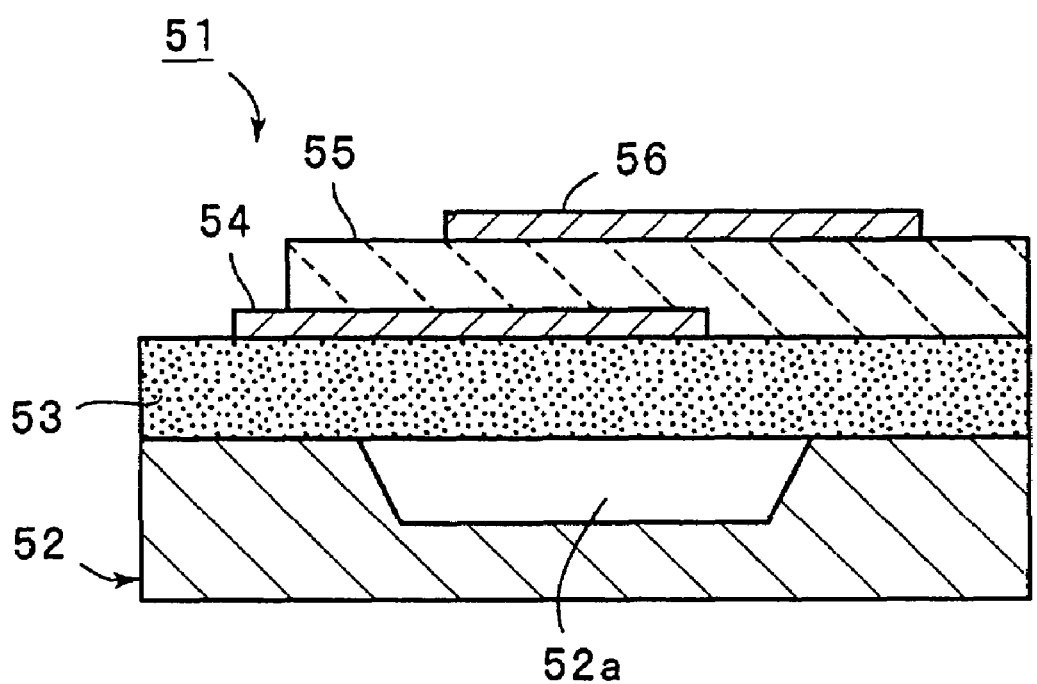
FIG. 14 is a surface cross-sectional view showing a piezoelectric thin-film resonator defining a portion of the ladder filter shown in FIG. 12.

In addition, FIG. 14 is a front cross-sectional view showing one piezoelectric thin-film resonator defining the ladder filter.

As shown in FIG. 14, a piezoelectric thin-film resonator 51 includes a substrate 52 having a recess portion 52a which is open to the upper side. An insulating film 53 is laminated so as to cover this recess portion 52a. Then, on the insulating film 53, a lower electrode 54, a piezoelectric thin film 55, and an upper electrode 56 are laminated, such that a diaphragm is formed. The piezoelectric thin film 55 is preferably made of an appropriate piezoelectric material, such as titanate zirconate lead ceramic, ZnO, or AlN. The electrodes 54 and 56 are preferably made of an appropriate metal or alloy, such as Al or Ag. The polarization axes of the piezoelectric thin film 55 are aligned in the thickness direction. Thus, when a voltage is applied to the piezoelectric thin film 55 from the electrodes 54 and 56, the piezoelectric thin film 55 oscillates. In this case, since the laminate structure is provided on the recess portion 52a of the substrate 52, the oscillation of the piezoelectric thin film 55 is not inhibited. As a result, resonance properties which are suitable for use in a high frequency band are obtained. The substrate 52 may be made of an appropriate insulating or semiconductor material, such as a Si substrate. In addition, the insulating film 53 may also be made of an insulating material, such as $Al_2O_3$, $SiO_2$, or AlN.

FIG. 12 is a schematic plan view of a ladder filter having a two-stage structure defined by a plurality of piezoelectric thin-film resonators described above. In FIG. 12, the piezoelectric thin films are not shown. In a ladder filter 61, a portion surrounded by a dotted line defines a diaphragm 62. That is, the diaphragm 62 indicates an upper portion of the recess portion 52a of the piezoelectric thin-film resonator 51 which defines an oscillation portion. In this diaphragm 62, two parallel arm resonators 63 and 65 and two series arm resonators 64 and 66 are provided. More particularly, in the ladder filter 61, a lower electrode 68 is arranged so as to be connected to the ground potential. In addition, an upper electrode 67 is connected to an input terminal. An upper electrode 69 is connected to the ground potential. In addition, an upper electrode 70 is connected to an output terminal. Thus, the ladder filter having a two-stage structure shown in FIG. 13 is provided.

Figure 15:
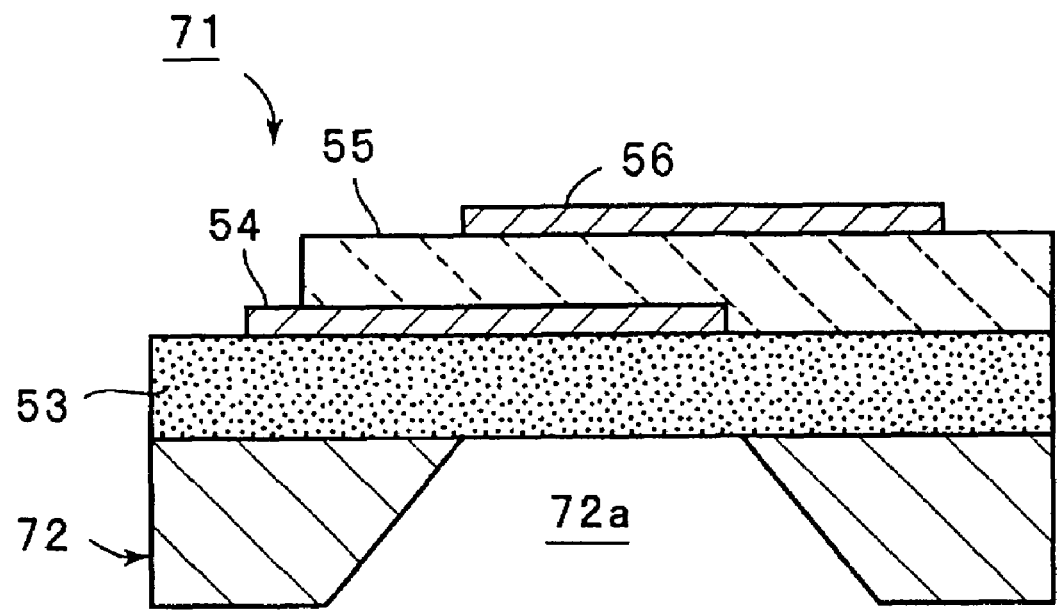
FIG. 15 is a schematic front cross-sectional view showing another example of a piezoelectric thin-film resonator.

In the piezoelectric thin-film resonator 51 shown in FIG. 14, the recess portion 52a opening to the upper side is provided in the substrate 52. However, as shown in FIG. 15, a piezoelectric thin-film resonator 71 may also be used which includes a substrate 72 having a penetrating hole 72a, the diameter of which increases toward the lower side. In this case, the insulating film 53 is laminated so as to cover the upper opening of the penetrating hole 72a. In addition, on the insulating film 53, the lower electrode 54, the piezoelectric thin-film 55, and the upper electrode 56 are laminated, such that the diaphragm is provided.

Figure 16:
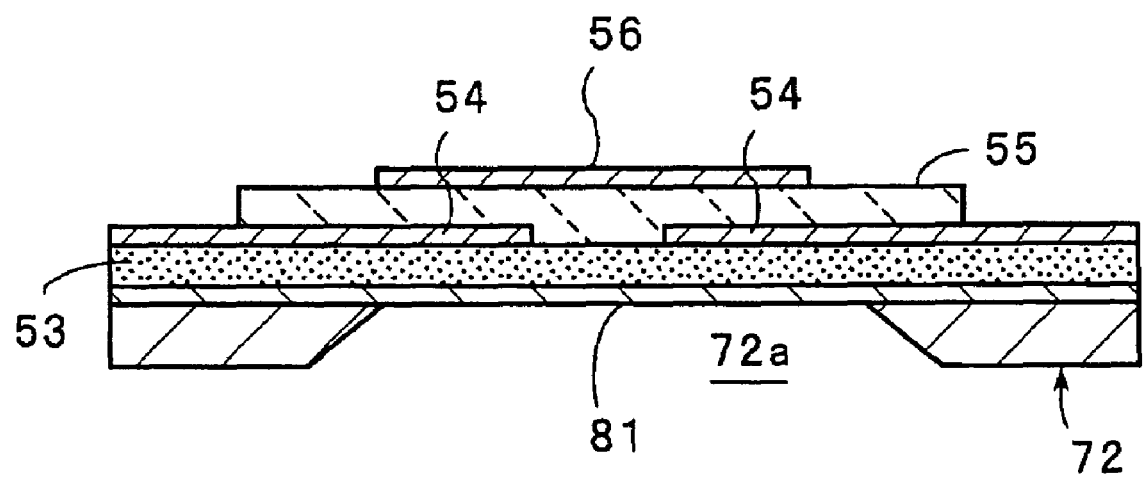
FIG. 16 is a schematic front cross-sectional view showing still another example of a piezoelectric thin-film resonator.
Figure 17:
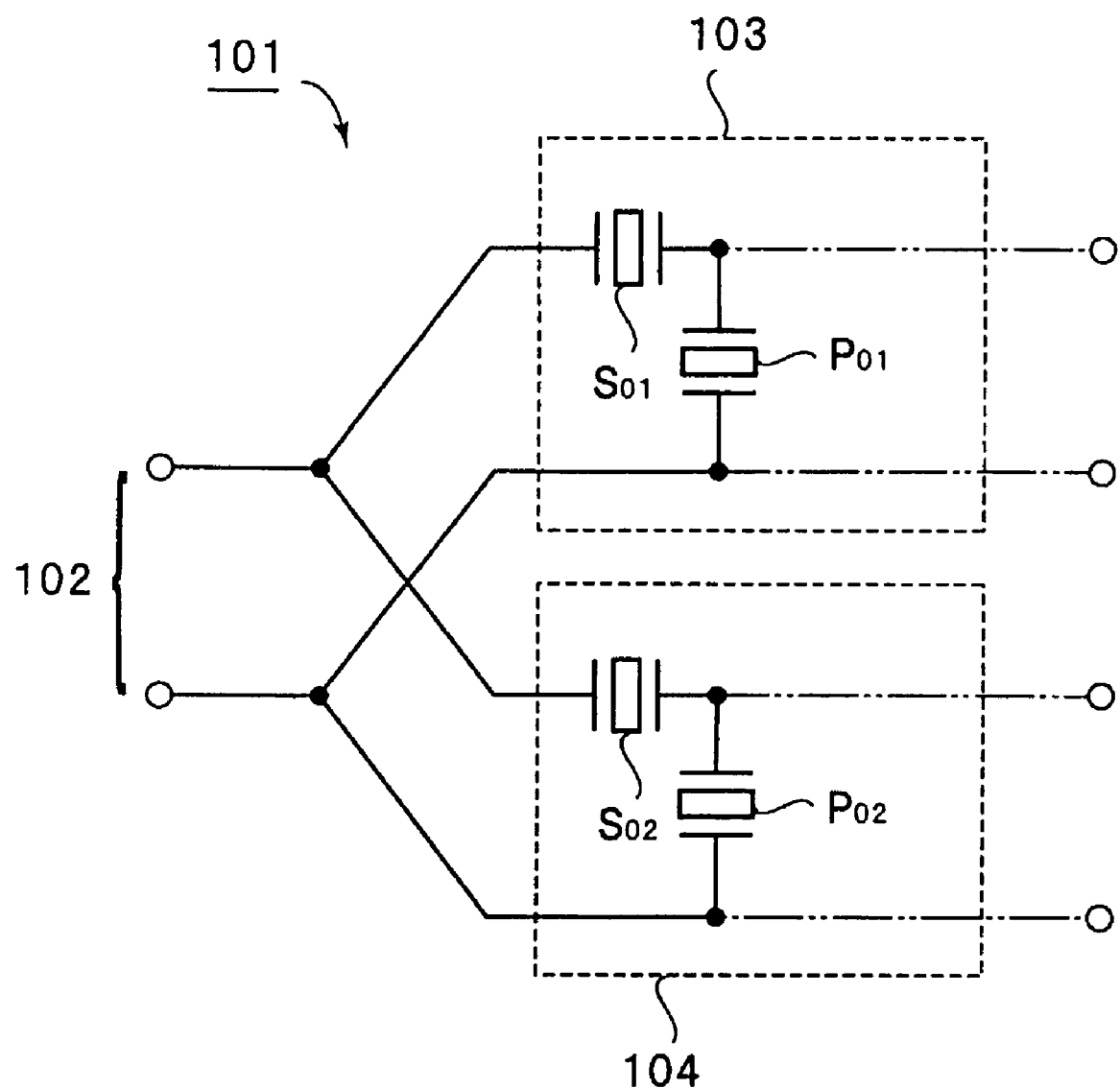
FIG. 17 is a circuit diagram illustrating one example of a conventional branching filter.

Furthermore, as shown in FIG. 16, a common electrode 81 may be provided at the lower side of the insulating film 53 so as to face a pair of lower electrodes 54 with the insulating film 53 provided therebetween. In this case, the upper electrode 56 faces the pair of lower electrodes 54, such that a pair of resonator portions is provided. In addition, between the common electrode 81 and the lower electrodes 54, respective capacitors may be provided. As described above, a piezoelectric thin-film resonator including the capacitors defined by the common electrode 81 and the lower electrodes 54 may be used in the ladder filer described above.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

The invention claimed is:

1. A branching filter comprising:
   a first filter with a relatively low passband including a first temperature property-improvement thin film; and
   a second filter with a relatively high passband including a second temperature property-improvement thin film; wherein
   a thickness of the first temperature property-improvement thin film is different from that of the second temperature property-improvement thin film such that the temperature coefficient of frequency of the first filter is greater than that of the second filter.

2. The branching filter according to claim 1, wherein the first filter and the second filter are surface acoustic wave filters.

3. The branching filter according to claim 2, wherein each of the surface acoustic wave filters include a piezoelectric substrate made of one of a $LiTaO_3$ substrate and a $LiNbO_3$ substrate, and the first and the second temperature property-improvement thin films are $SiO_2$ films provided on the piezoelectric substrate.

4. The branching filter according to claim 3, wherein a thickness of the $SiO_2$ film provided on the first filter is greater than that of the $SiO_2$ film provided on the second filter.

5. The branching filter according to claim 4, wherein, when the wavelength of the second filter is represented by λ2, the thickness of the $SiO_2$ film provided on the second filter is in a range of about 0.08 λ2 to about 0.28 λ2.

6. The branching filter according to claim 4, wherein, when the wavelength of the first filter is represented by λ1, the thickness of the $SiO_2$ film of the first filter is in a range of about 0.18 λ1 to about 0.38 λ1.

7. The branching filter according to claim 6, wherein, when the wavelength of the second filter is represented by λ2, the thickness of the $SiO_2$ film provided on the second filter is in a range of about 0.08 λ2 to about 0.28 λ2.

8. The branching filter according to claim 1, wherein the first filter and the second filter are piezoelectric thin-film resonance filters.

9. The branching filter according to claim 8, wherein each of the piezoelectric thin-film resonators comprises:
   a substrate having a recess portion opening to an upper side thereof;
   an insulating film laminated so as to cover the recess portion of the substrate;
   a lower electrode disposed on the insulating film;
   a piezoelectric thin film disposed on the lower electrode; and
   an upper electrode disposed on the piezoelectric thin film so as to face the lower electrode.

10. The branching filter according to claim 9, wherein the piezoelectric thin film is made of one of a titanate zirconate lead ceramic, ZnO and AlN.

11. The branching filter according to claim 9, wherein the upper and lower electrodes are made of one of Al and Ag.

12. The branching filter according to claim 8, wherein each of the piezoelectric thin-film resonators comprises:
   a substrate having a penetrating hole extending from an upper side to a lower side thereof;
   an insulating film laminated so as to cover an upper opening of the penetrating hole;
   a lower electrode disposed on the insulating film;
   a piezoelectric thin film disposed on the lower electrode; and
   an upper electrode disposed on the piezoelectric thin film so as to face the lower electrode.

13. The branching filter according to claim 8, wherein each of the piezoelectric thin-film resonators comprises:
- a substrate having a penetrating hole extending from an upper side to a lower side thereof;
- a common electrode disposed so as to cover an upper opening of the penetrating hole;
- an insulating film disposed on the common electrode;
- a pair of lower electrodes disposed on the insulating film;
- a piezoelectric thin film disposed on the pair of lower electrodes; and
- an upper electrode disposed on the piezoelectric thin film so as to face each of the pair of lower electrodes.

14. The branching filter according to claim 1, wherein the first filter and the second filter are ladder filters each including a plurality of series arm resonators and a plurality of parallel arm resonators.

15. The branching filter according to claim 14, further comprising at least one inductance element connected in series to one of the plurality of parallel arm resonators of the ladder filter of the first filter.

16. The branching filter according to claim 14, further comprising at least one inductance element connected in parallel to one of the plurality of series arm resonators of the ladder filter of the second filter.

17. The branching filter according to claim 1, wherein the first filter and the second filter include different piezoelectric substrates and are defined by respective chip components.

18. The branching filter according to claim 1, wherein the first filter and the second filter include the same piezoelectric substrate and are collectively defined by a single chip component.

19. A branching filter comprising:
- a first surface acoustic wave filter with a relatively low passband including a first temperature property-improvement thin film; and
- a second surface acoustic wave filter with a relatively high passband including a second temperature property-improvement thin film; wherein
- a thickness of the first temperature property-improvement thin film is different from that of the second temperature property-improvement thin film such that the temperature coefficient of frequency of the first filter is greater than that of the second filter; and
- at least one of the first and second surface acoustic wave filters includes structural elements that are configured such that the temperature coefficient of frequency is positive with respect to a change in temperature.

20. The branching filter according to claim 19, wherein at least one of the first and second surface acoustic wave filters includes:
- a piezoelectric substrate made of one of a $LiTaO_3$ and a $LiNbO_3$ substrate; and
- electrodes provided on the piezoelectric substrate;
- at least one of the first and second temperature property-improvement thin films is defined by a $SiO_2$ film disposed so as to cover the electrodes on the piezoelectric substrate; and
- when a wavelength determined by an electrode cycle is represented by $\lambda$, the thickness of the $SiO_2$ film is in a range of about 0.3 $\lambda$ to about 0.38 $\lambda$ so as to have the positive temperature coefficient of frequency with respect to the change in temperature.

* * * * *